US008071985B2

(12) United States Patent
Sakurai et al.

(10) Patent No.: US 8,071,985 B2
(45) Date of Patent: Dec. 6, 2011

(54) DISPLAY DEVICE AND METHOD OF MANUFACTURING THE SAME

(75) Inventors: Toru Sakurai, Kounan (JP); Yusaku Morimoto, Gifu-ken (JP); Yutaka Umetani, Nagoya (JP)

(73) Assignee: Sony Corporation, Tokyo (JP)

( * ) Notice: Subject to any disclaimer, the term of this patent is extended or adjusted under 35 U.S.C. 154(b) by 225 days.

(21) Appl. No.: 11/855,753

(22) Filed: Sep. 14, 2007

(65) Prior Publication Data
US 2008/0067519 A1 Mar. 20, 2008

(30) Foreign Application Priority Data

Sep. 14, 2006 (JP) ................................ 2006-249670
Sep. 14, 2006 (JP) ................................ 2006-249671
Jul. 9, 2007 (JP) ................................ 2007-179898

(51) Int. Cl.
*H01L 29/04* (2006.01)
(52) U.S. Cl. ........... 257/72; 257/E27.111; 257/E21.413; 257/71; 438/29; 349/43
(58) Field of Classification Search .................... 257/72; 349/38, 42, 43, 44
See application file for complete search history.

(56) References Cited

U.S. PATENT DOCUMENTS

| | | | | |
|---|---|---|---|---|
| 5,292,675 A | * | 3/1994 | Codama | 438/163 |
| 5,563,427 A | * | 10/1996 | Yudasaka et al. | 257/72 |
| 5,594,569 A | * | 1/1997 | Konuma et al. | 349/122 |
| 6,590,229 B1 | * | 7/2003 | Yamazaki et al. | 257/71 |
| 6,661,476 B1 | * | 12/2003 | Abe et al. | 349/38 |
| 6,955,953 B2 | * | 10/2005 | Yamazaki et al. | 438/162 |
| 7,038,642 B2 | * | 5/2006 | Miyajima et al. | 345/87 |
| 7,414,267 B2 | * | 8/2008 | Yamazaki et al. | 257/72 |
| 7,964,874 B2 | * | 6/2011 | Yamazaki et al. | 257/71 |
| 2003/0184705 A1 | * | 10/2003 | Murade et al. | 349/158 |
| 2005/0247940 A1 | * | 11/2005 | Shibata et al. | 257/66 |
| 2006/0220021 A1 | * | 10/2006 | Yamazaki et al. | 257/59 |
| 2007/0007527 A1 | * | 1/2007 | Koyama | 257/59 |
| 2007/0040175 A1 | * | 2/2007 | Jeong et al. | 257/66 |
| 2007/0120189 A1 | * | 5/2007 | Yamazaki et al. | 257/347 |
| 2007/0159565 A1 | * | 7/2007 | Segawa et al. | 349/38 |
| 2007/0165149 A1 | * | 7/2007 | Kim et al. | 349/39 |
| 2007/0187741 A1 | * | 8/2007 | Lee et al. | 257/306 |
| 2007/0211187 A1 | * | 9/2007 | Misaki et al. | 349/38 |

(Continued)

FOREIGN PATENT DOCUMENTS

JP 11-111998 4/1999

*Primary Examiner* — Victor A Mandala
*Assistant Examiner* — William Harriston
(74) *Attorney, Agent, or Firm* — K&L Gates LLP (57) ABSTRACT

The invention provides a display device having a thin film transistor and a storage capacitor storing a display signal applied to a pixel electrode through this thin film transistor on a substrate, where dielectric strength between electrodes forming the storage capacitor is enhanced for increasing the yield. In the storage capacitor, a lower storage capacitor electrode, a thin lower storage capacitor film, a polysilicon layer, an upper storage capacitor film and an upper storage capacitor electrode are layered. The polysilicon layer is formed by crystallization by laser annealing. The polysilicon layer of the storage capacitor is microcrystalline and thus the flatness of its surface is enhanced. The pattern of the polysilicon layer (storage capacitor electrode) is formed larger than the bottom portion of an opening, and the edge of its peripheral portion is located on a buffer film on the slant portion of the opening or on the buffer film on the outside of the opening.

19 Claims, 4 Drawing Sheets

U.S. PATENT DOCUMENTS

| | | | |
|---|---|---|---|
| 2008/0002076 A1* | 1/2008 | Yagi et al. | 349/39 |
| 2008/0230871 A1* | 9/2008 | Yamazaki et al. | 257/532 |
| 2008/0265254 A1* | 10/2008 | Nishiura | 257/59 |
| 2009/0121227 A1* | 5/2009 | Itoh et al. | 257/59 |
| 2009/0127562 A1* | 5/2009 | Arao | 257/71 |
| 2009/0135158 A1* | 5/2009 | Takahashi et al. | 345/174 |

* cited by examiner

DISPLAY DEVICE AND METHOD OF MANUFACTURING THE SAME

CROSS-REFERENCE OF THE INVENTION

This invention claims priority from Japanese Patent Applications Nos. 2006-249670, 2006-249671 and 2007-179898, the contents of which are incorporated herein by reference in these entirety.

BACKGROUND OF THE INVENTION

1. Field of the Invention

The invention relates to a display device having a thin film transistor and a storage capacitor storing a display signal applied to a pixel electrode through this thin film transistor on a substrate and a method of manufacturing the same.

2. Description of the Related Art

An active matrix type liquid crystal display device has a pixel selecting thin film transistor (hereafter, referred to as a "pixel TFT") in each of a plurality of pixels disposed into a matrix on a glass substrate. It also has a storage capacitor formed for storing a display signal applied to a pixel electrode through the pixel TFT.

This liquid crystal display device and a method of manufacturing the device will be described referring to FIG. 5. A light-shielding metal layer 11 as a light-shielding layer made of molybdenum, chromium, or the like for blocking external light incident on a first substrate 10 is formed on a first substrate 10 in a pixel TFT portion. This light-shielding metal layer 11 prevents a light leakage current caused by light entering a pixel TFT 100T. Then, a buffer film 53 made of an insulation film such as a silicon oxide film, a silicon nitride film or the like is formed over the light-shielding metal layer 11 by, for example, PE-CVD (Plasma Enhanced Chemical Vapor Deposition). An amorphous silicon layer is then formed on the buffer film 53. The amorphous silicon layer is then crystallized by laser annealing to form a polysilicon layer 55. The polysilicon layer 55 is etched into an island-like pattern. The polysilicon layer 55 functions as an active layer of the pixel TFT 100T and a storage capacitor electrode in a storage capacitor 100C.

Then, a gate insulation film 56 made of a silicon oxide film or the like is formed over the polysilicon layer 55 by PE-CVD. This gate insulation film 56 serves as a storage capacitor film 56C in the storage capacitor 100C.

Then, a gate electrode 57 made of molybdenum, chromium or the like is formed on the gate insulation film 56 of the pixel TFT 100T. On the storage capacitor film 56C, an upper capacitor electrode 58 made of the same metal as that of the gate electrode 57 is formed. An impurity is then ion-implanted in the polysilicon layer 55 using the gate electrode 57 and the upper capacitor electrode 58 as a mask to form a source and a drain. This impurity is phosphorus or arsenic for an N-channel type thin film transistor. A region between the source and the drain serves as a channel.

Then, an interlayer insulation film 19 is formed over the gate electrode 57 and the upper capacitor electrode 58. Contact holes CH1 and CH2 are provided in the gate insulation film 56 and the interlayer insulation film 19, and a drain electrode 20D and a source electrode 20S are formed through these contact holes CH1 and CH2, being connected with the polysilicon layer 55. Then, according to needs, a passivation film 21 made of a silicon nitride film or the like and a planarization film 22 made of a photosensitive material or the like are formed over the source electrode 20S and the drain electrode 20D. A contact hole CH3 is provided in the passivation film 21 and the planarization film 22, and a pixel electrode 23 made of transparent metal such as ITO (Indium Tin Oxide) or the like is formed through the contact hole CH3, being connected with the source electrode 20S.

Furthermore, a second substrate 30 made of a transparent material such as glass is attached to the first substrate 10, sealing a liquid crystal layer LC. A common electrode 31 made of transparent metal such as ITO is formed on the second substrate 30, being opposed to the pixel electrode 23. A polarizing plate (not shown) is formed on the first substrate 10 and the second substrate 30.

An operation of this display device is as follows. When the pixel TFT 100T turns on in response to a pixel selection signal applied to the gate electrode 57, the alignment of the liquid crystal molecules of the liquid crystal layer LC is controlled in response to a display signal applied to the pixel electrode 23 through the source electrode 20S. At this time, the display signal is applied to the pixel electrode 23 for a predetermined period by being stored in the storage capacitor 100C. In this manner, a transmission amount of light from a backlight BL in a pixel is controlled, thereby making a black or white display. The relevant technology is described in Japanese Patent Application Publication No. Hei 11-111998.

When the polysilicon layer 55 having crystal grain size of 300 to 400 nm is formed by crystallizing the amorphous silicon layer by laser annealing, protrusions occur in a polysilicon grain boundary portion on the surface of the polysilicon layer 55, of which the height is twice the thickness of the polysilicon layer 55. These protrusions cause degradation of the coverage of the storage capacitor film 56C layered on the storage capacitor electrode and reduce dielectric strength between the polysilicon layer 55 (the storage capacitor electrode) and the upper storage capacitor electrode 58, and the yield may reduce. When the polysilicon layer 55 is formed under the condition of enhancing the flatness of the surface, the crystal grain size is reduced and thus the resistance of the storage capacitor electrode is increased. This increases contact resistance between the thin film transistor and the storage capacitor, and the yield may reduce.

SUMMARY OF THE INVENTION

The invention provides a display device having a thin film transistor and a storage capacitor storing a display signal applied to a pixel electrode through the thin film transistor on a substrate, the thin film transistor including: a light-shielding layer formed on the substrate; a polysilicon layer formed on the light-shielding layer with a buffer film being interposed therebetween; a gate insulation film covering the polysilicon layer; and a gate electrode formed on the gate insulation film, and the storage capacitor including: a lower storage capacitor electrode formed on the substrate; a lower storage capacitor film thinner than the buffer film, being in contact with the lower storage capacitor electrode through an opening of the buffer film formed on the lower storage capacitor electrode; a storage capacitor electrode formed on the lower storage capacitor electrode with the lower storage capacitor film being interposed therebetween and having a microcrystalline polysilicon portion of which crystal grain size is smaller than that of the polysilicon layer on the buffer film; an upper storage capacitor film covering the storage capacitor electrode; and an upper storage capacitor electrode formed on the storage capacitor electrode with the upper storage capacitor film being interposed therebetween.

With this structure, since the storage capacitor electrode is made of microcrystalline polysilicon and the flatness of the surface is enhanced, dielectric strength between the storage capacitor electrode and the upper storage capacitor electrode is enhanced.

In addition to the above structure, a pattern of the storage capacitor electrode is formed larger than a bottom portion of the opening, an edge of a peripheral portion of the storage capacitor electrode is located on the buffer film on a slant portion of the opening or on the buffer film on an outside of the opening, and crystal grain size of the peripheral portion of the storage capacitor electrode is larger than crystal grain size of the storage capacitor electrode on an inner side from the peripheral portion.

With this structure, the pattern of the storage capacitor electrode is formed larger than the bottom portion of the opening, the edge of the peripheral portion of the storage capacitor electrode is located on the buffer film on the slant portion of the opening or the buffer film on the outside of the opening, and the crystal grain size of the peripheral portion of the storage capacitor electrode is larger than that on the inner side from the peripheral portion. Therefore, the sheet resistance of the peripheral portion of the storage capacitor electrode is reduced, thereby achieving reduction of the contact resistance between the thin film transistor and the storage capacitor. Furthermore, disconnection of the storage capacitor electrode due to the step of the opening is prevented.

The invention also provides a method of manufacturing a display device having a thin film transistor and a storage capacitor storing a display signal applied to a pixel electrode through this thin film transistor on a substrate, the method including: forming a light-shielding layer and a lower storage capacitor electrode on the substrate; forming a buffer film over the light-shielding layer and the lower storage capacitor electrode; forming an opening in the buffer film on the lower storage capacitor electrode selectively by etching; forming a lower storage capacitor film thinner than the buffer film on the lower storage capacitor electrode through the opening; forming a polysilicon layer on the buffer film and the lower storage capacitor film by forming an amorphous silicon layer thereon and performing laser annealing to this amorphous silicon layer; forming a storage capacitor electrode by patterning the polysilicon layer; forming a gate insulation film over the polysilicon layer and an upper storage capacitor film over the storage capacitor electrode; and forming a gate electrode on the gate insulation film and forming an upper storage capacitor electrode on the upper storage capacitor film.

DETAILED DESCRIPTION OF THE INVENTION

Figure 1:
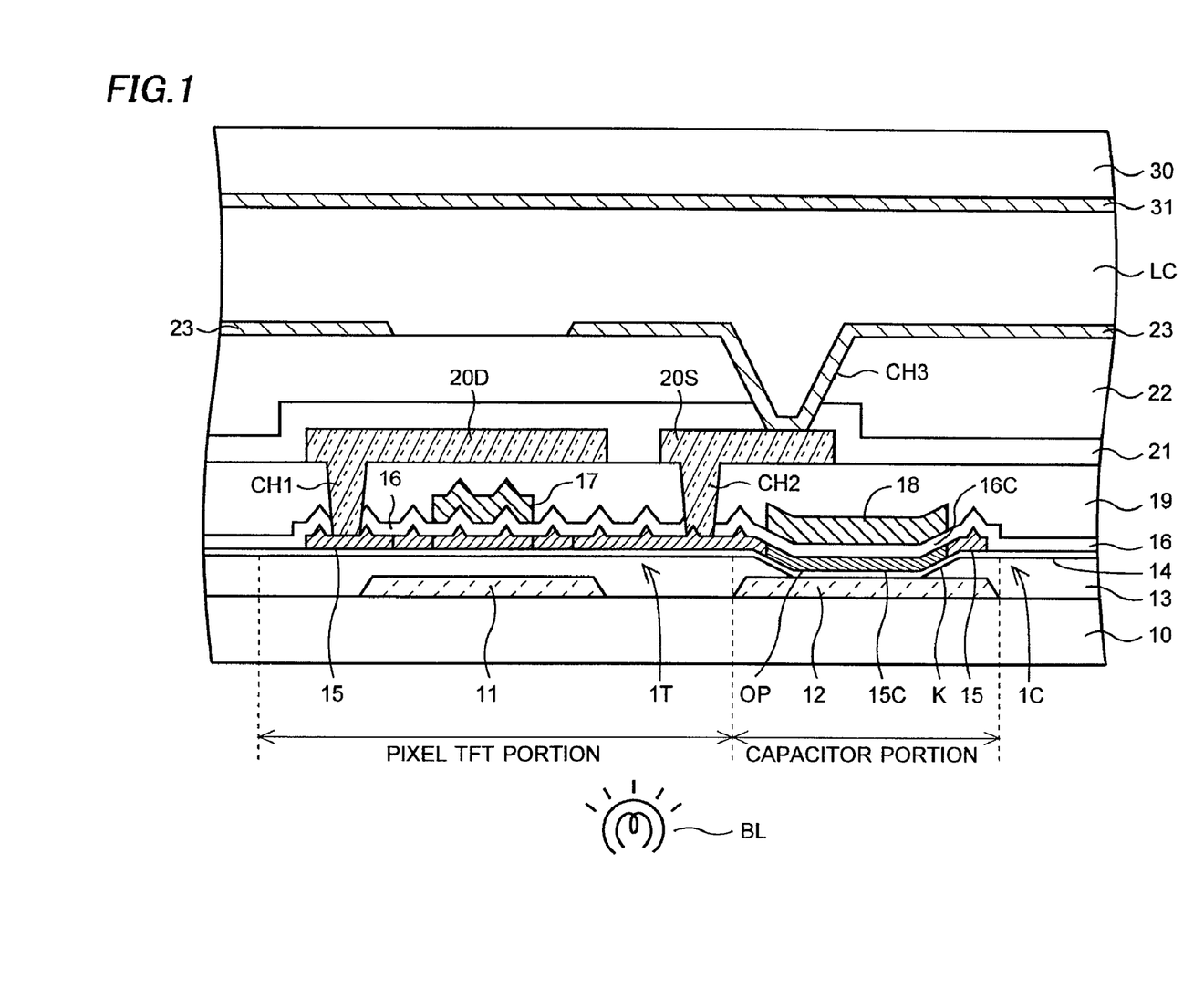
FIG. 1 is a cross-sectional view of a liquid crystal display device of an embodiment of the invention.
Figure 2:
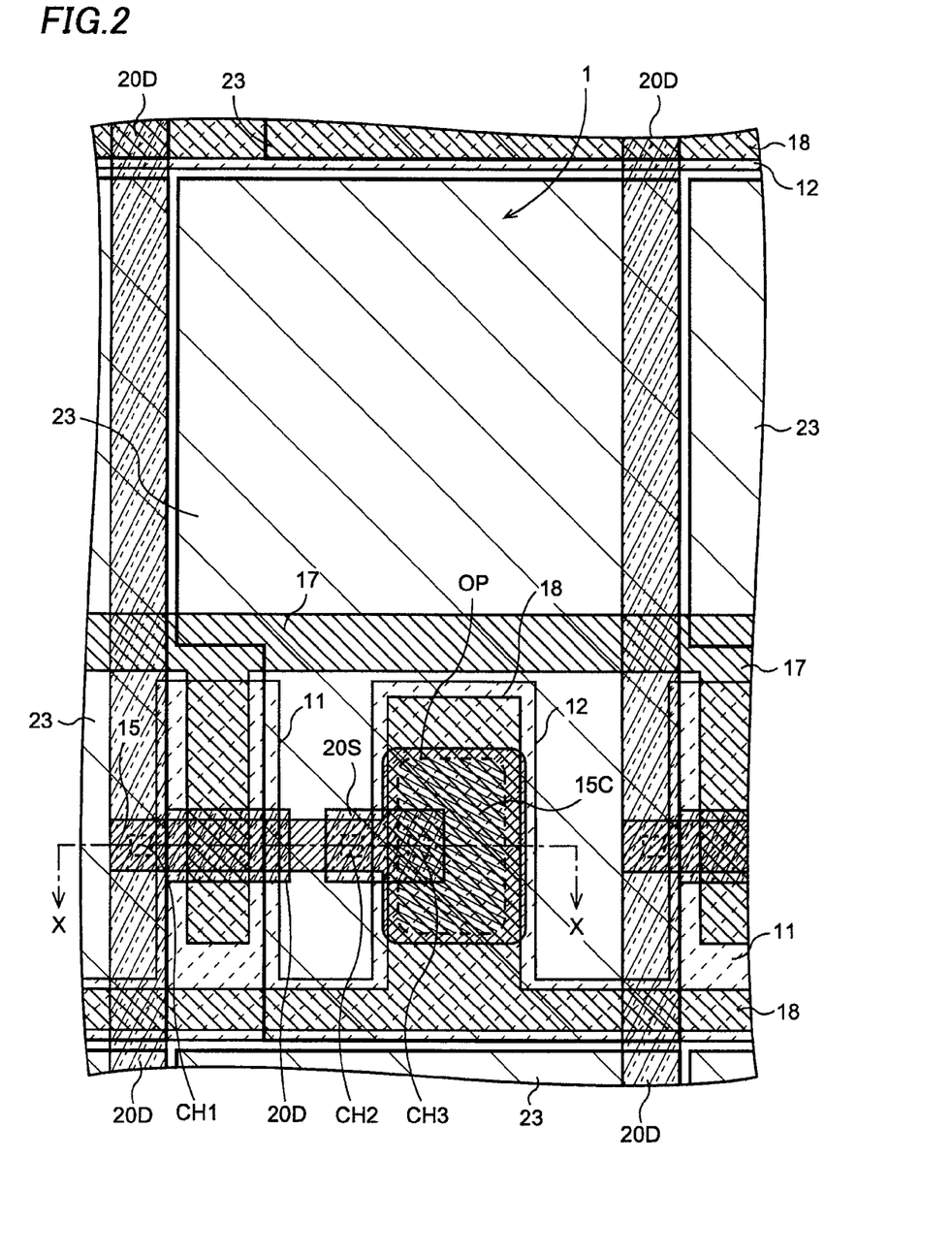
FIG. 2 is a plan view of the liquid crystal display device of the embodiment of the invention.

A display device and a method of manufacturing the display device of an embodiment of the invention will be described referring to figures. Although a plurality of pixels is formed in this display device, FIG. 1 shows one pixel 1. A cross-sectional structure on a first substrate 10 side shown in FIG. 1 corresponds to a cross-section of a plan view of FIG. 2 along line X-X. The same numerals are given to the same components in FIG. 1 and FIG. 2 as those shown in FIG. 5.

The first substrate 10 made of a transparent insulation material such as glass includes a pixel TFT portion where a pixel TFT 1T is formed and a capacitor portion where a storage capacitor 1C is formed. First, a light-shielding metal layer 11 made of molybdenum, chromium or the like and blocking external light incident on the first substrate 10 is formed on the first substrate 10 in the pixel TFT portion. A lower storage capacitor electrode 12 is formed on the first substrate 10 in the capacitor portion. The lower storage capacitor electrode 12 is preferably made of the same material as that forming the light-shielding metal layer 11. In this case, a metal layer for the light-shielding metal layer 11 is formed on the first substrate 10 and then patterned to form the light-shielding metal layer 11 and the lower storage capacitor electrode 12. The light-shielding metal layer 11 is preferably connected with a gate electrode 17 that will be described below. Otherwise, the potential of the light-shielding metal layer 11 may be a predetermined constant potential such as a ground voltage, and in this case the light-shielding metal layer 11 and the lower storage capacitor electrode 12 may be connected.

Then, a buffer film 13 made of an insulation film such as a silicon oxide film or a silicon nitride film is formed over the light-shielding metal layer 11 and the lower storage capacitor electrode 12 by PE-CVD (Plasma Enhanced Chemical Vapor Deposition) or the like. The sum of thicknesses of the buffer layer 13 and a lower storage capacitor layer 14 which will be described below is preferably 300 nm or more for realizing uniform crystal grain size in the polysilicon layer 15. The buffer film 13 on the lower storage capacitor electrode 12 is selectively etched to form an opening OP exposing the lower storage capacitor electrode 12. At this time, a slant portion K is formed on the edge of the opening OP of the buffer film 13.

Then, the lower storage capacitor film 14 is formed over the buffer film 13 and the lower storage capacitor electrode 12 exposed in the opening OP. This lower storage capacitor film 14 is formed so as to contact the lower storage capacitor electrode 12 exposed in the opening OP. The thickness of the lower storage capacitor film 14 is smaller than that of the buffer film 13, preferably 100 nm or less. The lower storage capacitor film 14 is made of an insulation film such as a silicon oxide film or a silicon nitride film and formed by PE-CVD (Plasma Enhanced Chemical Vapor Deposition) or the like.

Then, an amorphous silicon layer having a thickness of about 45 nm is formed on the lower storage capacitor film 14. The amorphous silicon layer is then crystallized by laser annealing or preferably excimer laser annealing to form a polysilicon layer 15 having crystal grain size of about 300 to 400 nm. At this time, heat generated by the laser annealing in a polysilicon layer 15C in the capacitor portion before completion of crystallization is diffused more easily through the lower storage capacitor film 14 and the lower storage capacitor electrode 12 than in the polysilicon layer 15 on the light-shielding metal layer 11 before completion of crystallization, since the lower storage capacitor film 14 under the polysilicon layer 15C is thinner than the buffer film 13 on the light-shielding metal layer 11 of the pixel TFT 1T. This makes the polysilicon crystal grain size of the polysilicon layer 15C on the lower storage capacitor film 14 and the lower storage capacitor electrode 12 smaller than that of the polysilicon layer 15 of the pixel TFT 1T since the crystal growth of the polysilicon layer 15C is less. As a result, under the laser annealing condition where the crystal grain size of about 300 to 400 nm is obtained in the polysilicon layer 15 of the pixel TFT 1T, the crystal grain size of the polysilicon layer 15C of the storage capacitor 1C is about 50 nm or less as microcrystals, thereby enhancing the flatness of the polysilicon layer 15C.

Then, an impurity is ion-implanted in the polysilicon layer 15C. By this process, the polysilicon layer 15C in the capacitor portion functions as the storage capacitor electrode. The polysilicon layers 15 and 15C are formed into a predetermined pattern.

Then, a gate insulation film 16 is formed over the polysilicon layers 15 and 15C in the pixel TFT portion and the capacitor portion. The gate insulation film 16 overlapping the polysilicon layer 15C of the storage capacitor 1C functions as an upper storage capacitor film 16C.

Then, a gate electrode 17 made of molybdenum, chromium or the like is formed on the gate insulation film 16 in the pixel TFT portion. An upper storage capacitor electrode 18 is formed on the upper storage capacitor film 16C. Since the upper storage capacitor film 16C reflects the flatness of the lower polysilicon layer 15C, dielectric strength between the polysilicon layer 15C (storage capacitor electrode) and the upper storage capacitor electrode 18 is enhanced.

The upper storage capacitor electrode 18 is made of the same material as that forming the gate electrode 17. In detail, a metal layer for the gate electrode 17 is formed on the gate insulation film 16 and the upper storage capacitor film 16C and then patterned to form the gate electrode 17 and the upper storage capacitor electrode 18.

Accordingly, capacitors are formed on the upper and lower sides of the polysilicon layer 15C as the storage capacitor electrode in the storage capacitor 1C. This increases capacitance per unit area.

Then, an impurity is ion-implanted in the polysilicon layer 15 in the pixel TFT portion using the gate electrode 17 and the upper storage capacitor electrode 18 as a mask to form a source and a drain. This impurity is phosphorus or arsenic for an N-channel type thin film transistor. The region between the source and the drain serves a channel. According to needs, a source and a drain of an LDD (Lightly Doped Drain) structure consisting of a low concentration impurity layer and a high concentration impurity layer may be formed.

Then, an interlayer insulation film 19 is formed over the gate electrode 17 and the upper storage capacitor electrode 18. Components above this layer, i.e., the interlayer insulation film 19, a source electrode 20S and a drain electrode 20D respectively connected with the source and the drain of the polysilicon layer 15, a passivation film 21, a planarization film 22, and a pixel electrode 23, are formed in the similar manner to that shown in FIG. 5.

Figure 5:
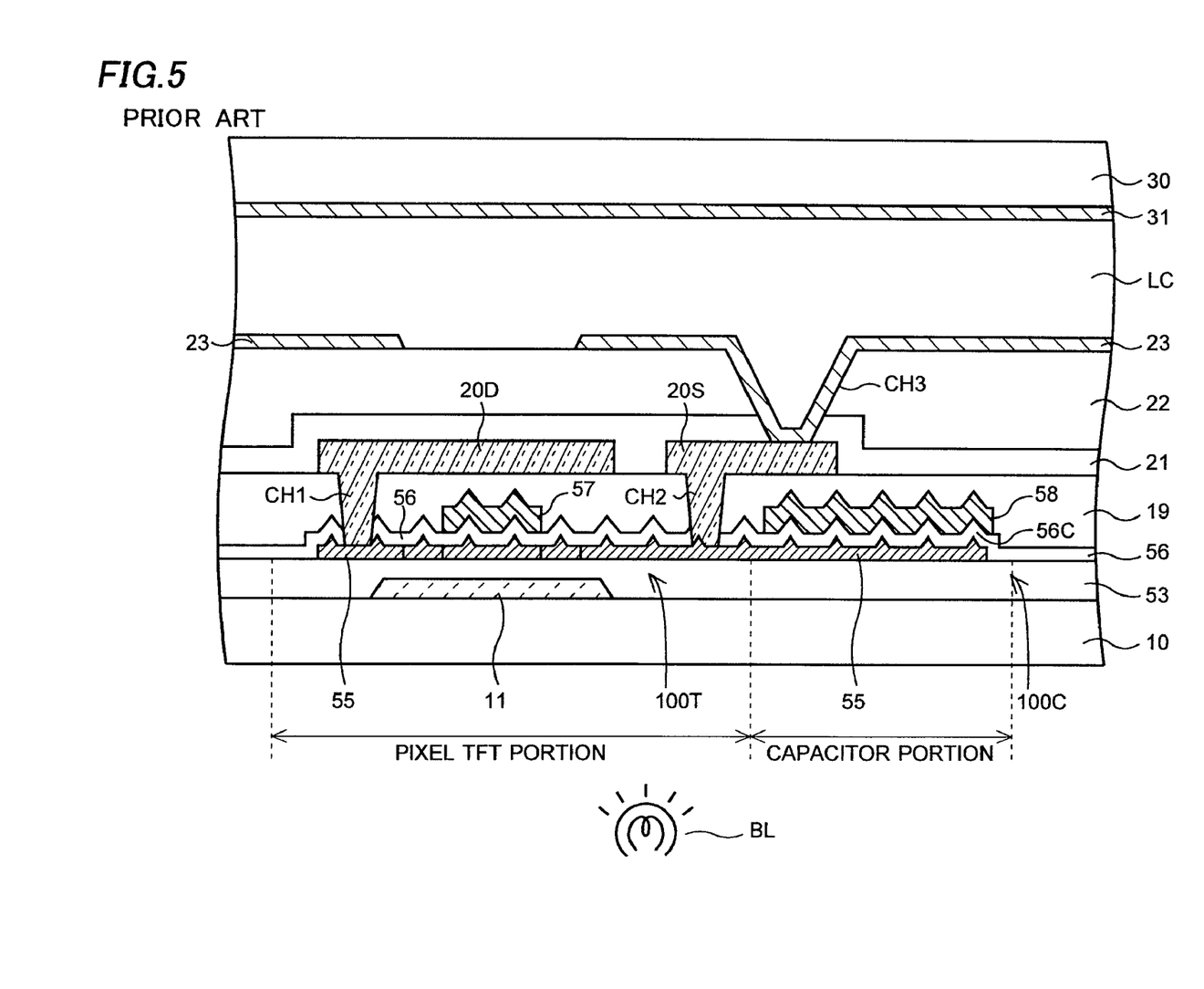
FIG. 5 is a cross-sectional view of a conventional liquid crystal display device.

The second substrate 30 and the common electrode 31 are also attached to the first substrate 10 in the similar manner to that shown in FIG. 5, and a liquid crystal layer LC is sealed between these. A polarizing plate (not shown) is formed on the first substrate 10 and the second substrate 30. A display operation of this display device is the same as shown in the conventional art.

Figure 3:
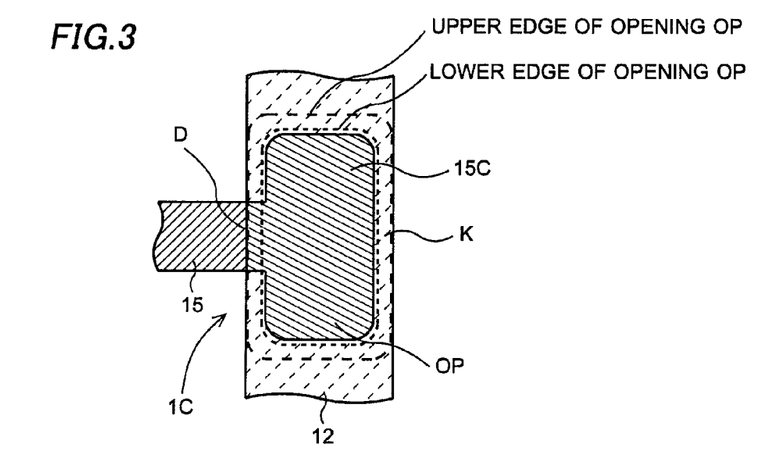
FIG. 3 is a plan view of a storage capacitor of the liquid crystal display device of the embodiment of the invention.
Figure 4:
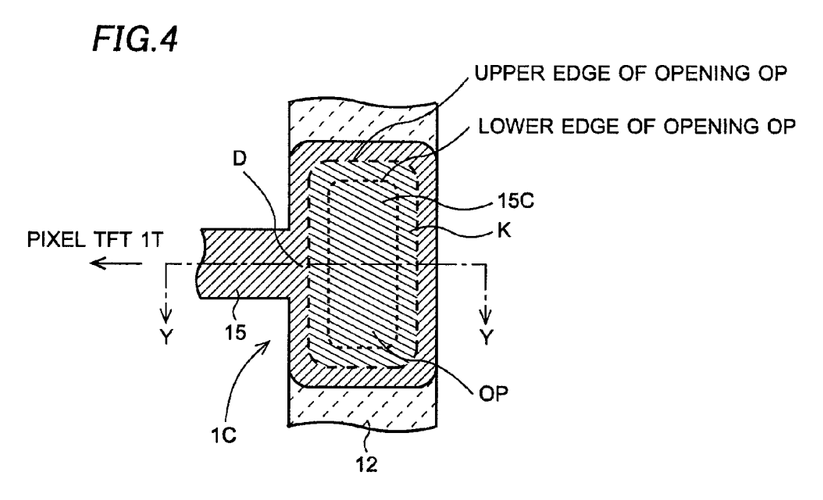
FIG. 4 is a plan view of the storage capacitor of the liquid crystal display device of the embodiment of the invention.

Then, the other feature of the structure of the storage capacitor 1C will be described referring to FIGS. 3 and 4. FIGS. 3 and 4 are plan views of the storage capacitor 1C, and the cross-section of FIG. 4 along line Y-Y corresponds to the cross-section of the storage capacitor 1C of FIG. 1. If the pattern of the polysilicon layer 15C (storage capacitor electrode) is smaller than the bottom portion of the opening OP of the buffer film 13 as shown in FIG. 3, the resistance of the polysilicon layer 15C in that portion is high since it is made of microcrystalline polysilicon and thus there is a problem that contact resistance between the polysilicon layer 15C and the source of the pixel TFT 1T becomes high. Furthermore, if step coverage on the opening OP is insufficient, disconnection may occur at its step portion D.

Therefore, as shown in FIG. 4, the pattern of the polysilicon layer 15C (storage capacitor electrode) is formed larger than the bottom portion of the opening OP so that the edge of the peripheral portion of the polysilicon layer 15C is located on the buffer film 13 on the slant portion K of the opening OP or on the buffer film 13 on the outside of the opening OP. Accordingly, the crystal grain size of the peripheral portion of the polysilicon layer 15C (storage capacitor electrode) becomes larger than the crystal grain size of the polysilicon layer 15C on the inner side from the peripheral portion. That is, the pattern of the polysilicon layer 15C (storage capacitor electrode) is formed so that a high-resistance microcrystalline polysilicon portion is surrounded by a low-resistance peripheral microcrystalline polysilicon portion. This reduces the contact resistance between the source of the pixel TFT 1T and the polysilicon layer 15C (storage capacitor electrode). Furthermore, covering the whole step of the opening OP with the storage capacitor electrode 18 also minimizes the disconnection of the storage capacitor electrode at the step portion. The upper storage capacitor electrode 18 may be disposed avoiding overlapping the peripheral portion of the polysilicon layer 15C (storage capacitor electrode) where the flatness is not preferable. This prevents the dielectric strength between the upper storage capacitor electrode 18 and the polysilicon layer 15 from reducing.

Although the pixel electrode 23 is disposed on the first substrate 10 and the common electrode 31 is disposed on the second substrate 30 in this embodiment, the invention is also applicable to a liquid crystal display device having the other structure than this. For example, the invention is also applicable to a liquid crystal display device of an FFS (Fringe-Field Switching) mode or an IPS (In-Plain Switching) mode where both a pixel electrode and a common electrode are disposed on the first substrate 10 and the liquid crystal layer LC is optically controlled using an electric field in almost horizontal direction with respect to the first substrate 10. In the FFS mode, the pixel electrode and the common electrode are disposed being opposed to each other over an insulation film, so that a capacitor is formed. This additional capacitor increases the total capacitance of the storage capacitor 1C, so that this is further available for higher definition and higher aperture ratio.

Although a liquid crystal display device is used as an example for describing this embodiment, the invention is also applicable to the other display device than the liquid crystal display device, for example, a display device with an organic electroluminescent element.

The embodiment provides a display device having a thin film transistor and a storage capacitor storing a display signal applied to a pixel electrode through this thin film transistor on a substrate, in which dielectric strength between electrodes forming the storage capacitor is enhanced for increasing the yield.

The embodiment also realizes the storage capacitor which achieves bulk storage in a small area, so that this is available for higher definition and higher aperture ratio.

The embodiment achieves lower contact resistance between the thin film transistor and the storage capacitor and also prevents the disconnection of the storage capacitor electrode caused by the step of the opening formed in the storage capacitor portion.

What is claimed is:

1. A display device comprising:
   a substrate;
   a thin film transistor disposed on the substrate and configured to receive a display signal, the thin film transistor comprising:
   (a) a light-shielding layer disposed on the substrate;
   (b) a buffer film disposed on the light shielding layer, the buffer film having:
       (i) an opening;
       (ii) a bottom portion;
       (iii) a top portion; and
       (iv) a slant portion such that the bottom portion is smaller than the top portion;
   (c) a first portion of a polysilicon layer disposed on the buffer film, the first portion of the polysilicon layer having:
       (i) a surface;
       (ii) protrusions formed on the surface; and
       (iii) a first grain size;
   (d) a gate insulation film disposed on the first portion of the polysilicon layer, the gate insulation film covering the protrusions; and
   (e) a gate electrode disposed on the gate insulation film; and
   a storage capacitor disposed on the substrate and configured to store the display signal supplied by the thin film transistor, the storage capacitor comprising:
   (a) a lower storage capacitor electrode disposed on the substrate;
   (b) a lower storage capacitor film disposed pn the buffer film, the lower storage capacitor film being:
       (i) in contact with the lower storage capacitor electrode through the opening in the buffer film; and
       (ii) thinner than the buffer film;
   (c) a middle storage capacitor electrode disposed on the lower storage capacitor film, the middle storage capacitor:
       (i) being formed of a second portion of the polysilicon layer;
       (ii) having an edge portion;
       (iii) being larger than the bottom portion of the buffer film such that the edge portion is located over the slant portion of the buffer film; and
       (iv) having a second grain size which is smaller than the first grain size;
   (d) an upper storage capacitor film disposed on the middle storage capacitor electrode; and
   (e) an upper storage capacitor electrode disposed on the upper storage capacitor film.

2. The display device of claim 1, wherein the second grain size is smaller than a third grain size of the second portion of the polysilicon layer which is located on the slant portion.

3. The display device of claim 1, wherein:
   (a) the middle storage capacitor electrode is larger than a bottom of the buffer film so that the entire edge portion of the middle storage capacitor electrode is located on the buffer film; and
   (b) the second grain size is smaller than a third grain size of the second portion of the polysilicon layer which is along the edge portion of the middle storage capacitor electrode.

4. The display device of claim 1, wherein a sum of thicknesses of the buffer film and the lower storage capacitor film is 300 nm or more.

5. The display device of claim 2, wherein a sum of thicknesses of the buffer film and the lower storage capacitor film is 300 nm or more.

6. The display device of claim 3, wherein a sum of thicknesses of the buffer film and the lower storage capacitor film is 300 nm or more.

7. The display device of claim 1, wherein a thickness of the lower storage capacitor film is 100 nm or less.

8. The display device of claim 2, wherein a thickness of the lower storage capacitor film is 100 nm or less.

9. The display device of claim 3, wherein a thickness of the lower storage capacitor film is 100 nm or less.

10. The display device of claim 2, wherein the edge portion of the middle storage capacitor electrode does not overlap the upper storage capacitor electrode.

11. The display device of claim 3, wherein the edge portion of the middle storage capacitor electrode does not overlap the upper storage capacitor electrode.

12. A method of manufacturing a display device, comprising:
    (a) forming a light-shielding layer and a lower storage capacitor electrode on a substrate;
    (b) forming a buffer film on the light-shielding layer and the lower storage capacitor electrode, the buffer film having: (i) a bottom portion; (ii) a top portion; and (iii) a slant portion such that the bottom portion is smaller that the top portion;
    (c) forming an opening in the buffer film to expose at least partially the lower storage capacitor electrode;
    (d) forming a lower storage capacitor film thinner than the buffer film on the exposed lower storage capacitor electrode;
    (e) forming, after the formation of the lower storage capacitor film, an amorphous silicon layer on the buffer film and the lower storage capacitor electrode;
    (f) transforming the amorphous silicon layer into a polysilicon layer by layer annealing while the amorphous silicon layer is exposed so that the polysilicon layer above the buffer film has protrusions on a surface thereof;
    (g) forming a middle storage capacitor electrode by patterning the polysilicon layer, the middle storage capacitor: (i) having an edge portion; and (ii) being larger than the bottom portion of the buffer film such that the edge portion is located over the slant portion of the buffer film;
    (h) forming a gate insulation film on the polysilicon layer and an upper storage capacitor film on the middle storage capacitor electrode; and
    (i) forming a gate electrode on the gate insulation film and an upper storage capacitor electrode on the upper storage capacitor film.

13. The method of claim 12, wherein the storage capacitor electrode is formed so as to be larger than a bottom portion of the opening and have an edge located on the buffer film on an outside of the bottom portion.

14. The method of claim 12, wherein a sum of thicknesses of the buffer film and the lower storage capacitor film is 300 nm or more.

15. The method of claim 12, wherein a sum of thicknesses of the buffer film and the lower storage capacitor film is 300 nm or more.

16. The method of claim 13, wherein a sum of thicknesses of the buffer film and the lower storage capacitor film is 300 nm or more.

17. The method of claim 12, wherein a thickness of the lower storage capacitor film is 100 nm or less.

18. The method of claim 12, wherein a thickness of the lower storage capacitor film is 100 nm or less.

19. The method of claim 13, wherein a thickness of the lower storage capacitor film is 100 nm or less.

* * * * *